(12) United States Patent
Chen

(10) Patent No.: US 7,385,814 B1
(45) Date of Patent: Jun. 10, 2008

(54) FIXING MECHANISM FOR A FAN FRAME

(75) Inventor: Jung-Lung Chen, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/704,083

(22) Filed: Feb. 7, 2007

(51) Int. Cl.
*H05K 7/20* (2006.01)
*H05K 5/00* (2006.01)

(52) U.S. Cl. ............... 361/695; 165/122; 312/236; 415/213.1; 454/184; 361/687

(58) Field of Classification Search ........ 361/690–698; 165/80.3, 104.33, 122; 312/223.2, 236; 415/213.1, 415/214.1, 232; 248/605–606, 634–635
See application file for complete search history.

(56) References Cited

U.S. PATENT DOCUMENTS

| | | | |
|---|---|---|---|
| 5,464,187 A * | 11/1995 | Linkner, Jr. | 248/635 |
| 7,002,796 B2 * | 2/2006 | Lao et al. | 361/695 |
| 7,245,488 B2 * | 7/2007 | Chen | 361/695 |
| 2007/0135033 A1 * | 6/2007 | Kao et al. | 454/184 |
| 2007/0153477 A1 * | 7/2007 | Liang | 361/695 |
| 2008/0014093 A1 * | 1/2008 | Fan et al. | 416/244 R |

FOREIGN PATENT DOCUMENTS

CN 200983133 Y * 11/2007

* cited by examiner

*Primary Examiner*—Jayprakash Gandhi
*Assistant Examiner*—Robert J Hoffberg
(74) *Attorney, Agent, or Firm*—Peter F. Corless; Steven M. Jensen; Edwards Angell Palmer & Dodge LLP

(57) ABSTRACT

A fixing mechanism fixes a side of a fan frame having a plurality of cooling fans and two first connecting tabs opposing to each other to a bottom board of a housing. The fixing mechanism includes a first end portion fixed to the bottom board; a second end portion perpendicularly installed on the first end portion; two second connecting tabs corresponding to the first connecting tabs and installed on the second end portion; an elastic buffer installed between one of the first connecting tabs and one of the second connecting tabs corresponding to the one of the first connecting tabs; and an elastic arced strip passing through the first connecting tabs and the second connecting tabs, for holding the elastic buffer between the one of the first connecting tabs and the one of the second connecting tabs, so as to fixing the fixing mechanism to the fan frame.

9 Claims, 2 Drawing Sheets

FIXING MECHANISM FOR A FAN FRAME

BACKGROUND OF THE INVENTION

1. Field of the Invention

This invention generally relates to fixing mechanisms, and more specifically, to a fixing mechanism for a fan frame.

2. Description of Related Art

Servers rely on cooling fans to dissipate heat. Generally, a cooling fan applied in a server and a fan frame in which the cooling fan is installed are assembled to form a cooling fan assembly.

The fan frame is fixed to a bottom board of a housing of the sever by screws. Two fixing mechanisms made of bended plates each having two bended ends are installed on two sides of the fan frames. For both of the fixing mechanisms, one of the bended ends is fixed to the fan frame, and the other of the bended ends is fixed to the bottom board of the housing by screws, such that the fan frame is fixed to the bottom board of the housing. In operation, the cooling fan vibrates and makes noises. To reduce the noises, an elastic washer is mounted on a screw first and then the screw with the elastic washer mounted is screwed to the bottom board of the housing.

However, the screw, if being mounted with the elastic washer and having too few the screw threads, is easily to be loosed from the bottom board of the housing. Therefore, the cooling fan makes louder noises.

Moreover, the elastic washer becomes thinner than it used to be because it is pressed by the screw, and too thin the elastic washer has poor vibration absorbing capability. Further, the elastic washer, if being pressed for a long time, shows elastic fatigue.

SUMMARY OF THE INVENTION

In view of the drawbacks of the prior art mentioned above, it is a primary objective of the present invention to provide a fixing mechanism, which is capable of providing an excellent shock absorber quality.

It is another objective of the present invention to provide a fixing mechanism, which includes durable the vibration-absorbing material.

It is a further objective of the present invention to provide a fixing mechanism, which is capable of providing an excellent shock absorber quality as well as high stability.

To achieve the aforementioned and other objectives, a fixing mechanism is provided according to the present invention. The fixing mechanism is capable of fixing a side of a fan frame having a plurality of cooling fans and two first connecting tabs opposing to each other to a bottom board of a housing of an electronic device. The fixing mechanism includes a first end portion fixed to the bottom board; a second end portion perpendicularly installed on the first end portion; two second connecting tabs corresponding to the first connecting tabs and installed on the second end portion; an elastic buffer installed between one of the first connecting tabs and one of the second connecting tabs corresponding to the one of the first connecting tabs; and an elastic arced strip passing through the first connecting tabs and the second connecting tabs, for holding the elastic buffer between the one of the first connecting tabs and the one of the second connecting tabs, so as to fixing the fixing mechanism to the fan frame and reduce vibration generated due to a spinning of the cooling fans with the installation of the elastic buffer.

Compared with the elastic washer of the prior art which provides only limited buffer effect because of the strong extruding pressure from the screw, the elastic buffer of the fixing mechanism of the present invention is installed between the first connecting tab and the second connecting tab, and the extruding pressure comes from the elastic arced strip, by choosing an elastic arced strip of proper elasticity, the elastic buffer will receive less extruding pressure and has higher elastic deformation capacity compared with the elastic washer of the prior art, thereby providing higher shock-proof effect. In addition, since the elastic arced strip also has elasticity, it is capable of cooperating with the elastic buffer and providing extra elastic deformation capacity to further enhance the shockproof effect.

Besides, compared with the prior art, wherein, the elastic washer is easily to have the disadvantages of elastic fatigue and low durability after keeping in the same elastic deformation for a long while, and since the elastic buffer of the fixing mechanism of the present invention has elasticity, while receiving extruding pressure, it is capable of stretching with full elasticity and thus does not easily produce elastic fatigue. Furthermore, the fixing mechanism is integrated to the fan frame via the elastic arced strip, and it is fixed to the bottom board via common screws or thumb screws, the fixing mechanism can be steadily fixed to the bottom board without the need of elastic washers for the screws that are for fixing the fixing mechanism to the bottom board as in the prior art.

In view of the aforementioned description, the fixing mechanism of the present invention is capable of overcoming the drawbacks in the prior art, thereby having high advantageous value of production.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
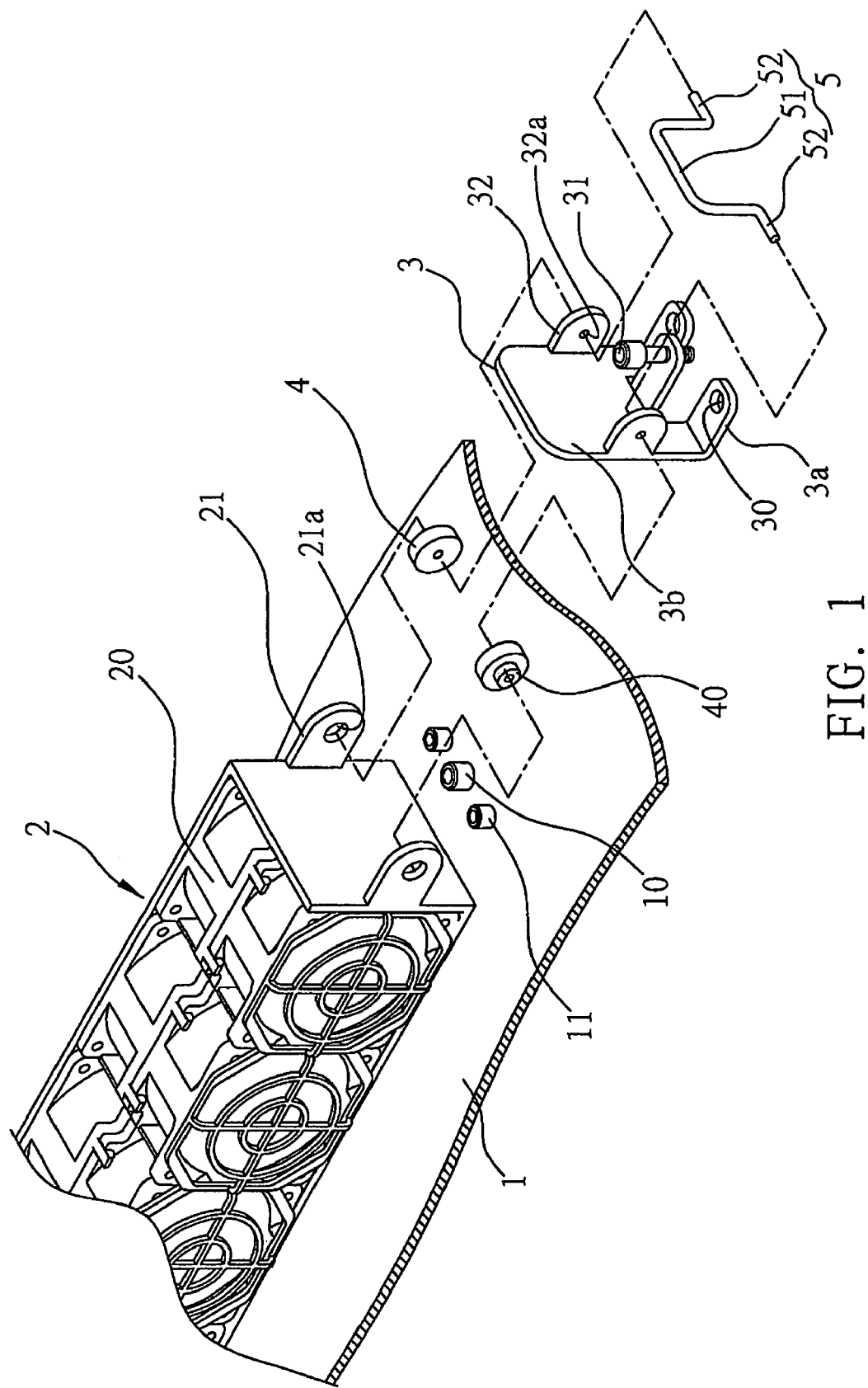
FIG. 1 is an exploded view of a fixing mechanism for fixing a fan frame to a bottom board of a housing of a first embodiment according to the present invention.

Please refer to FIG. 1, which is an exploded view of a fixing mechanism 3 for fixing a fan frame 2 to a bottom board 1 of a housing of a first embodiment according to the present invention. The bottom board 1 of the housing can be installed in an electronic device (not shown) such as a server for carrying a motherboard, on which a heat generating device, such as a memory card or a central processing unit (CPU), is installed. The fan frame 2 is installed on the bottom board 1. A plurality of cooling fans 20 are installed in the fan frame 2 for dissipating heat generated by the heat dissipating device. Two opposing sides of the fan frame 2 can be fixed to the bottom board 1 by the fixing mechanism 3. Since the two sides of the fan frame 2 have similar structure, only one of them is illustrated in FIG. 1 for clarifying the technical features of the present invention. Besides, note that the fan frame 2 can have only one of the two sides be fixed to the bottom board 1 by the fixing mechanism 3, and have the other one be fixed to the bottom board 1 by means of inserting, pivoting, or other fixing techniques.

The fixing mechanism 3 comprises a plate-shaped first end portion 3a and a plate-shaped second end portion 3b perpendicularly installed on the first end portion 3a. The first end portion 3a has a connecting element 31 such as a thumb screw, and the bottom board 1 has a stud 10 having outer thread corresponding to inner threads the thumb screw. Therefore, the fixing mechanism 3 can be fixed to the bottom board 1 by screwing the thumb screw to the stud 10. In addition, the bottom board 1 has two positioning dowels 11 installed on two sides of the stud 10, and the first end portion 3a has a positioning hole 30 corresponding to each of the positioning dowels 11. Therefore, the fixing mechanism 3 can be fixed to the bottom board in accurate angle.

Besides the thumb screw, the connecting element 31 can also be a general screw. Further, the fixing mechanism 3 also can be fixed to the bottom board 1 by other means, such as locking, repressing, and pivoting. However, for the consideration of both better fixing effect and the operation convenience, the present invention applies thumb screws as the connecting elements 31 for fixing the fixing mechanism to the bottom board 1.

Two first connecting tabs 21 opposing to each other and each having a first through hole 21a are installed on a side of the fan frame 2 where the fixing mechanism 3 is installed. Correspondingly, two second connecting tabs 32 opposing to each other and each having a second through hole 32a are installed on the fixing mechanism 3. The second connecting tabs 32 can be positioned between inner sides of the first connecting tabs 21, and the second through holes 32a and the first through holes 21a are through with each other while the second connecting tabs 32 is positioned between the first connecting tabs 21. An elastic buffer 4, such as an elastic body made of rubber or silica gel, is installed between each of the first connecting tabs 21 and each of the second connecting tabs 31. An elastic arced strip 5 having two ends propping against the inner side of each of the second connecting tabs 32 and passing through the first through hole 21a of the first connecting tab 21 and the second through hole 32a of the second connecting tab 32, allowing the elastic buffer 4 to be held between the first connecting tab 21 and the second connecting tab 32. Therefore, the fixing mechanism 3 is integrated with the fan frame 2, and the elastic buffer 4 is capable of reducing vibration generated due to the spinning of the cooling fans 20. However, the second connecting tabs 32 are not limited to be positioned between the inner sides of the first connecting tabs 21, the second connecting tabs 32 can also be positioned outside outer sides of the first connecting tabs 21 as well.

The elastic arced strip 5 comprises a bow body 51 for propping against the inner sides of the second connecting tabs 32 and two straight rod portions 52 installed on two ends of the bow body 51 for passing through the first through holes 21a of the first connecting tabs 21 and the second through holes 32a of the second connecting tabs 32.

The outer diameter of the elastic arced strip 5 matches the second diameter of the second through holes 32a of the second connecting tabs 32, and the first diameter of the first through holes 21a of the first connecting tabs 21 is greater than the outer diameter of the elastic arced strip 5. The elastic buffer 4 has a raised portion 40 having an outer diameter equal to or slightly greater than the first diameter of the first through hole 21a of the first connecting tab 21, for being inserted into the first through hole 21a of the first connecting tab 21 and containing the elastic arced strip 5, to prevent the elastic arced strip 5 from contacting the first through hole 21a of the first connecting tab 21 and generating related shocks while the cooling fans 20 are spinning.

It should be noted, the first through holes 21a of the first connecting tabs and the through holes 32a of the second connecting tabs can be all premade to match the elastic arced strip 5, and also choose the elastic buffers 4 of no raised portion 40, only if the through holes 21a of the first connecting tabs 21 are tightly matching with the elastic arced strip 5 and there is no space in between, since this can be clearly understood by those in the art, there is no needs of illustration herein.

Figure 2:
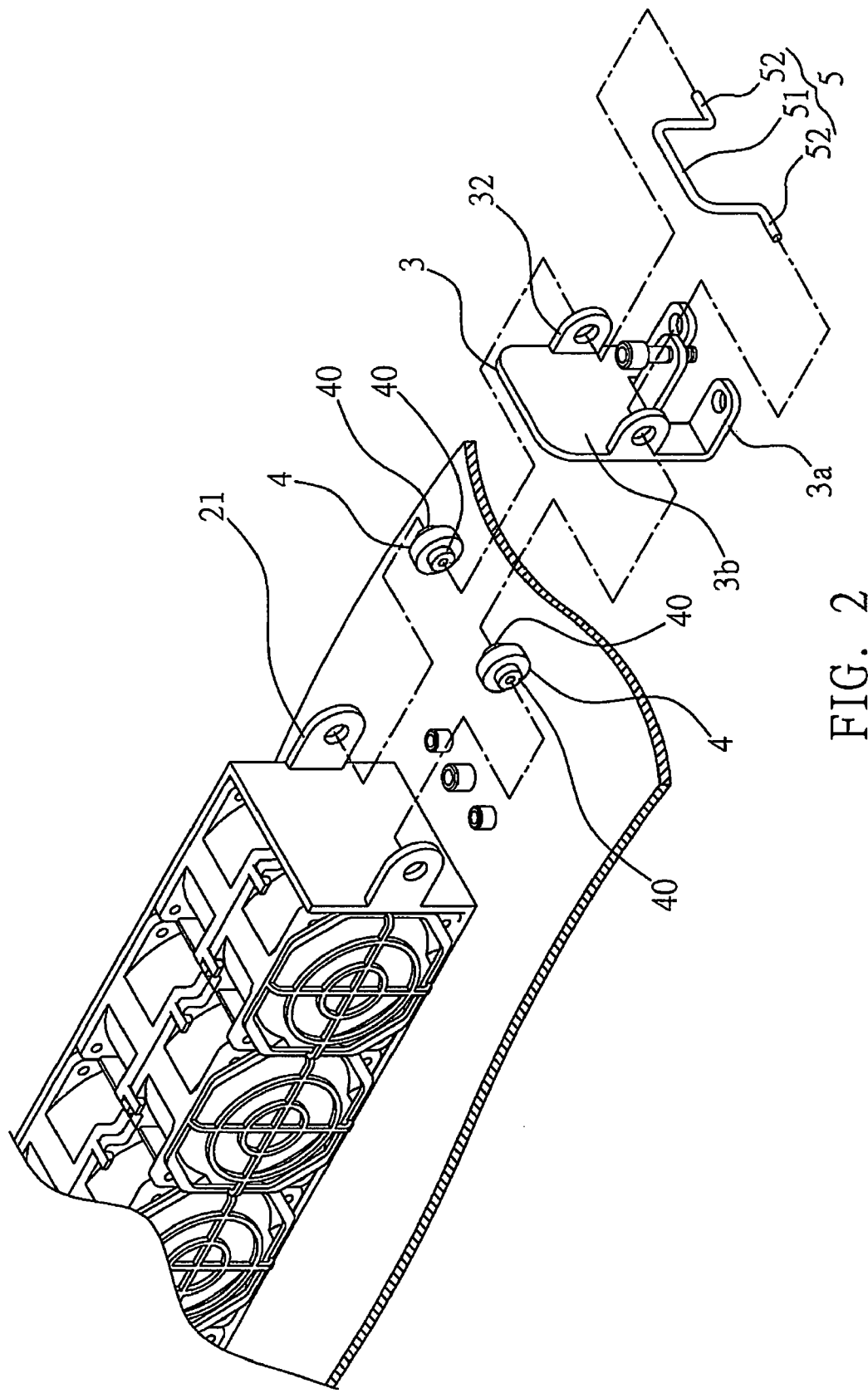
FIG. 2 is an exploded view of a fixing mechanism for fixing a fan frame to a bottom board of a housing of a second embodiment according to the present invention.

Please refer to FIG. 2, which is an exploded view of a fixing mechanism for fixing a fan frame to a bottom board of a housing of a second embodiment according to the present invention. The second embodiment differs from the first embodiment only in that two, rather than only one, raised portions 40 are installed on two sides of the elastic buffer 4, and both the first diameter of the first through hole 21a and the second diameter of the second through hole 32a are greater than the diameter of the elastic arced strip 5 and are equal to or slightly smaller than the outer diameter of the raised portion 40. Thus, the elastic arced strip 5 will contact with neither the first connecting tab 21 nor the second connecting tab 32, thereby enhancing the shockproof effect.

Compared with the elastic washer of the prior art, which provides only limited buffer effect because of the strong extruding pressure from the screw, the elastic buffer 4 of the fixing mechanism 3 of the present invention is installed between the first connecting tab 21 and the second connecting tab 32, and the extruding pressure comes from the elastic arced strip 5. By choosing an elastic arced strip of proper elasticity, the elastic buffer 4 will receive less extruding pressure and also has higher elastic deformation capacity compared with the elastic washer of the prior art, thereby enhancing shockproof effect. In addition, since the elastic arced strip 5 also has elasticity, it is capable of cooperating with the elastic buffer 4 and providing extra elastic deformation capacity to further enhance the shockproof effect.

In addition, compared with prior art that the elastic washer is easily to have the disadvantages of elastic fatigue and low durability after keeping in the same elastic deformation capacity for a long while, the elastic buffer 4 of the fixing mechanism 3 of the present invention, since receiving extruding pressure that has elasticity, is capable of stretching with full elasticity, and thus does not produce elastic fatigue easily.

Furthermore, the fixing mechanism 3 is integrated to the fan frame 2 via the elastic arced strip 5, and the fixing mechanism 3 itself can be fixed to the bottom board 1 via general screws or thumb screws, thus the fixing mechanism 3 can be steadily fixed to the bottom board 1 without the need of elastic washers for the screws that are for fixing the fixing mechanism to the bottom board as in the prior art.

In addition, the elastic fatigue of the elastic washer can not be noted easily according to the prior art. However, according to the fixing mechanism 3 of the present invention, the terminals of the elastic arced strip 5 are leveled with or a little sunk inside a new elastic buffer 4, and when the elastic buffer 4 is getting older and lacking of elasticity, users can easily detect that the terminals of the elastic arced strip 5 are protruding from the elastic buffer 4, and then it is about the time to have a new elastic buffer 4.

In view of the aforementioned description, the fixing mechanism of the present invention is capable of overcoming the drawbacks in the prior art, thereby having high advantageous value of production.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A fixing mechanism for fixing a side of a fan frame having a plurality of cooling fans and two first connecting tabs opposing to each other to a bottom board of a housing of an electronic device, the fixing mechanism comprising:
   a first end portion fixed to the bottom board;
   a second end portion perpendicularly installed on the first end portion;
   two second connecting tabs corresponding to the first connecting tabs and installed on the second end portion;
   an elastic buffer installed between one of the first connecting tabs and one of the second connecting tabs corresponding to the one of the first connecting tabs; and
   an elastic arced strip passing through the first connecting tabs and the second connecting tabs, for holding the elastic buffer between the one of the first connecting tabs and the one of the second connecting tabs, so as to fixing the fixing mechanism to the fan frame and reduce vibration generated due to a spinning of the cooling fans with the installation of the elastic buffer.

2. The fixing mechanism of claim 1, wherein the second connecting tabs are positioned between two inner sides of the first connecting tabs of the fan frame, and the elastic arced strip props against inner sides of the second connecting tabs.

3. The fixing mechanism of claim 2, wherein the elastic arced strip comprises an bow body for propping against the inner sides of the second connecting tabs and two straight rod portions installed on two ends of the bow body for passing through the first connecting tabs, the second connecting tabs and the elastic buffers.

4. The fixing mechanism of claim 1, wherein the one of the second connecting tabs has a second through hole having a second diameter equal to an outer diameter of the elastic arced strip, the one of the first connecting tabs has a first through hole having a first diameter greater than the outer diameter of the elastic arced strip, and the elastic buffer has a raised portion for being inserted into the first through hole of the one of the first connecting tab.

5. The fixing mechanism of claim 1, wherein the one of the first connecting tabs has a first through hole having a first diameter greater than an outer diameter of the elastic arced strip, the one of the second connecting tabs has a second through hole having a second diameter greater than the outer diameter of the elastic arced strip, and the elastic buffer has a raised portion, for being inserted into the first and second through holes.

6. The fixing mechanism of claim 1, wherein the bottom board further comprises two positioning dowels, and the fixing mechanism has two corresponding positioning holes installed on the first end portion.

7. The fixing mechanism of claim 1 being fixed to the bottom board by a connecting element.

8. The fixing mechanism of claim 7, wherein the connecting element is a thumb screw, and the bottom board has a stub has outer screw threads corresponding inner screw threads of the thumb screw.

9. The fixing mechanism of claim 1, wherein the elastic buffer is an elastic body made of either one of rubber and silica gel.

* * * * *